United States Patent
Lin et al.

(10) Patent No.: US 11,862,285 B2
(45) Date of Patent: *Jan. 2, 2024

(54) SENSE AMPLIFIER, MEMORY AND CONTROL METHOD OF SENSE AMPLIFIER

(71) Applicants: ANHUI UNIVERSITY, Anhui (CN); CHANGXIN MEMORY TECHNOLOGIES, INC., Hefei (CN)

(72) Inventors: Zhiting Lin, Hefei (CN); Jianqing Li, Hefei (CN); Jun He, Hefei (CN); Zhan Ying, Hefei (CN); Xin Li, Hefei (CN); Kanyu Cao, Hefei (CN); Wenjuan Lu, Hefei (CN); Chunyu Peng, Hefei (CN); Xiulong Wu, Hefei (CN); Junning Chen, Hefei (CN)

(73) Assignees: ANHUI UNIVERSITY, Anhui (CN); CHANGXIN MEMORY TECHNOLOGIES, INC., Anhui (CN)

( * ) Notice: Subject to any disclaimer, the term of this patent is extended or adjusted under 35 U.S.C. 154(b) by 248 days.

This patent is subject to a terminal disclaimer.

(21) Appl. No.: 17/474,166

(22) Filed: Sep. 14, 2021

(65) Prior Publication Data
US 2022/0068323 A1 Mar. 3, 2022

Related U.S. Application Data

(63) Continuation of application No. PCT/CN2020/139652, filed on Dec. 25, 2020.

(30) Foreign Application Priority Data

Sep. 1, 2020 (CN) .......................... 202010902453.9

(51) Int. Cl.
G11C 7/08 (2006.01)
G11C 7/12 (2006.01)
G11C 7/06 (2006.01)

(52) U.S. Cl.
CPC ................ *G11C 7/08* (2013.01); *G11C 7/062* (2013.01); *G11C 7/12* (2013.01)

(58) Field of Classification Search
CPC .. G11C 7/08; G11C 7/062; G11C 7/12; G11C 7/065; G11C 11/419; G11C 11/4091
(Continued)

(56) References Cited

U.S. PATENT DOCUMENTS 5,537,066 A 7/1996 Kawashima
5,764,103 A 6/1998 Burra
(Continued)

FOREIGN PATENT DOCUMENTS

CN 101540188 A 9/2009
CN 102148051 A 8/2011
(Continued)

OTHER PUBLICATIONS

International Search Report in the international application No. PCT/CN2020/139653, dated May 26, 2021. 2 pages.
(Continued)

*Primary Examiner* — Fernando Hidalgo
(74) *Attorney, Agent, or Firm* — Cooper Legal Group, LLC

(57) ABSTRACT

A sense amplifier, a memory and a method for controlling the sense amplifier are provided. The sense amplifier includes: an amplification module configured to read data in a storage unit on a first or second bit line; a control module electrically connected to the amplification module. When data in the storage unit on the first bit line is read, in a first amplification phase of the sense amplifier, the control module configures the amplification module to include a first current mirror structure and connects a mirror terminal of the first current mirror structure to the second bit line; when data in the storage unit on the second bit line is read, in the
(Continued)

first amplification phase of the sense amplifier, the control module configures the amplification module to include a second current mirror structure and connects a mirror terminal of the second current mirror structure to the first bit line.

18 Claims, 13 Drawing Sheets

(58) Field of Classification Search
USPC .................................................. 365/207
See application file for complete search history.

(56) References Cited

U.S. PATENT DOCUMENTS

| | | | |
|---|---|---|---|
| 5,990,737 | A | 11/1999 | Czarnul |
| 6,225,834 | B1 | 5/2001 | Gang |
| 6,529,421 | B1 | 3/2003 | Marr |
| 7,167,049 | B2 | 1/2007 | Lim |
| 8,072,200 | B1 | 12/2011 | Qiu |
| 8,416,602 | B2 | 4/2013 | Kitagawa |
| 9,418,714 | B2 | 8/2016 | Sinangil |
| 9,553,550 | B2 | 1/2017 | Puliafico |
| 9,698,765 | B1 | 7/2017 | La Rosa |
| 10,741,232 | B1 | 8/2020 | Jabeur |
| 10,783,969 | B2 | 9/2020 | Sheng |
| 11,315,610 | B1 | 4/2022 | Peng |
| 11,423,956 | B2 | 8/2022 | Shang |
| 11,423,957 | B2 * | 8/2022 | Peng .................. G11C 7/08 |
| 2004/0027892 | A1 | 2/2004 | Sim |
| 2004/0218446 | A1 | 11/2004 | Gogl |
| 2006/0044903 | A1 | 3/2006 | Forbes |
| 2007/0024325 | A1 | 2/2007 | Chen |
| 2008/0165602 | A1 | 7/2008 | Sutardja |
| 2009/0058512 | A1 | 3/2009 | Huang |
| 2009/0238582 | A1 | 9/2009 | Tsunoda |
| 2010/0157672 | A1 | 6/2010 | Barkley |
| 2010/0157698 | A1 | 6/2010 | Barth, Jr. |
| 2010/0182860 | A1 | 7/2010 | Chang |
| 2011/0110174 | A1 | 5/2011 | Cho |
| 2011/0148389 | A1 | 6/2011 | Bohannon |
| 2012/0235708 | A1 * | 9/2012 | Slamowitz ............. G11C 7/062 327/53 |
| 2013/0201761 | A1 | 8/2013 | Kim |
| 2013/0314977 | A1 | 11/2013 | Wang |
| 2013/0322154 | A1 | 12/2013 | Youn |
| 2015/0008841 | A1 | 1/2015 | Wu |
| 2015/0016183 | A1 | 1/2015 | Sinangil |
| 2015/0187394 | A1 | 7/2015 | Lee |
| 2015/0194209 | A1 | 7/2015 | Wu |
| 2015/0243350 | A1 | 8/2015 | Chen |
| 2016/0203856 | A1 | 7/2016 | Sachdev |
| 2018/0336952 | A1 | 11/2018 | Miyazaki |
| 2019/0007000 | A1 * | 1/2019 | Jeong ................. G11C 11/4096 |
| 2019/0279717 | A1 | 9/2019 | Sheng |
| 2019/0325946 | A1 | 10/2019 | Lu |
| 2019/0384337 | A1 | 12/2019 | Lu |
| 2020/0105315 | A1 | 4/2020 | Chang |
| 2020/0126615 | A1 | 4/2020 | Lei |
| 2020/0314374 | A1 | 10/2020 | Yang |
| 2022/0270653 | A1 | 8/2022 | Cao |
| 2022/0320076 | A1 | 10/2022 | Li |

FOREIGN PATENT DOCUMENTS

| | | | |
|---|---|---|---|
| CN | 102290086 | A | 12/2011 |
| CN | 102385900 | A | 3/2012 |
| CN | 102385901 | A | 3/2012 |
| CN | 102394094 | A | 3/2012 |
| CN | 102420005 | A | 4/2012 |
| CN | 102592650 | A | 7/2012 |
| CN | 102612715 | A | 7/2012 |
| CN | 202549301 | U | 11/2012 |
| CN | 102831921 | A | 12/2012 |
| CN | 103745743 | A | 4/2014 |
| CN | 105895139 | A | 8/2016 |
| CN | 106328182 | A | 1/2017 |
| CN | 106486143 | A | 3/2017 |
| CN | 106782652 | A | 5/2017 |
| CN | 107464581 | A | 12/2017 |
| CN | 108231100 | A | 6/2018 |
| CN | 108492840 | A | 9/2018 |
| CN | 109448768 | A | 3/2019 |
| CN | 109686387 | A | 4/2019 |
| CN | 109994140 | A | 7/2019 |
| CN | 210575115 | U | 5/2020 |
| CN | 210606637 | U | 5/2020 |
| CN | 111313848 | A | 6/2020 |
| CN | 111383674 | A | 7/2020 |
| CN | 111863054 | A | 10/2020 |
| CN | 111863055 | A | 10/2020 |
| CN | 111933194 | A | 11/2020 |
| CN | 111933195 | A | 11/2020 |
| EP | 2442311 | A1 | 4/2012 |
| KR | 20000039961 | A | 7/2000 |
| WO | 2021101709 | A1 | 5/2021 |

OTHER PUBLICATIONS

English translation of the Written Opinion of the International Search Authority in the international application No. PCT/CN2020/139653, dated May 26, 2021. 4 pages.

"Charge Sensitive Amplifier With Offset-Compensated V-to-I Converter for the Mini-SDD-Based DSSC Detector", 2019; A. Grande, C.Fiorini, F. Erdinger, P. Fischer and M. Porro; IEEE Transactions on Nuclear Science, vol. 66, No. 10, 7 pages.

"Experimental Validation of Charge-Sensitive Amplifier Configuration that Compensates for Detector Capacitance", Apr. 2016; Inyong Kwon, Taehoon Kang and Mark D. Hammig; IEEE Transactions on Nuclear Science, vol. 63, pp. 1202-1208. 7 pages.

"Design of Current-mirror Compensation Circuit for Multi-row Read in In-SRAM Computing", Date not available; Fang Yaqi; China Excellent Master's Degree Thesis Full Text Database & Information Science and Technology Series, vol. 2020, No. 7, 64 pages with English abstract.

"A 4T Dual Replica-Bitline Delay Technique Forprocess-Variation-Tolerant Low Voltage SRAM sense Amplifier Timing" Mar. 2015; Ye Ya-Dong, Wu Xiu-Long- Lin Zhi-Ting; Microelectronics & Computer, vol. 32, No. 3, 4 pages with English Abstract.

First Office Action of the Chinese application No. 202010902476.X, dated May 19, 2022. 13 pages with English translation.

Notice of Allowance of the Chinese application No. 202010902476.X, dated Aug. 4, 2022. 6 pages with English translation.

"Offset-Compensation High-Performance Sense Amplifier for Low-Voltage DRAM Based on Current Mirror and Switching Point", 2022, Pei Huang, Kua-Chang Chang, Junlin Ge, Chunyu Peng, Xiulong Wu, Junning Chen and Zhiting Lin; IEEE Transactions on Circuits and Systems, vol. 69, No. 4, pp. 2011-2015.

First Office Action of the U.S. Appl. No. 17/472,157, dated Jul. 5, 2023. 24 pages.

Final Office Action of the U.S. Appl. No. 17/472,157, dated Oct. 13, 2023. 45 pages.

International Search Report in the international application No. PCT/CN2020/139652, dated May 31, 2021. 2 pages.

English translation of the Written Opinion of the International Search Authority in the international application No. PCT/CN2020/139652, dated May 31, 2021. 4 pages.

"Novel Current-mirror Based Time Dependent Sense Scheme for MLC PRAM"; 2019; Jun-Tae Choi, Jun-Young Kweon, Yunheub Song and Tony Tae-Hyoung Kim; 2019 International Conference on Electronics, Information, and Communication (ICEIC), 3 pages.

"Design of a Low-voltage High-speed Sense Amplifier Circuit", Jun. 2016; Yang Guangjun; Research & Progress of SEE, 5 pages with English abstract.

"Design of a High Speed Sense Amplifier Circuit", Jun. 2015; Zhang Hua; Microelectronics, vol. 45, No. 3, 5 pages with English abstract.

(56) References Cited

OTHER PUBLICATIONS

First Office Action of the Chinese application No. 202010902453.9, dated May 19, 2022. 8 pages with English abstract.
Notice of Allowance of the Chinese application No. 202010902453.9, dated Aug. 4, 2022. 6 pages with English translation.
International Search Report in the international application No. PCT/CN2020/139627, dated May 17, 2021. 2 pages.
English translation of the Written Opinion of the International Search Authority in the international application No. PCT/CN2020/139627, dated May 17, 2021. 4 pages.
"Sensing Voltage Compensation Circuit for Low-power DRAM Bit-line Sense Amplifier", 2018; Suk Min Kim, Tae Woo Oh and Seong-Ook Jung; International Conference on Electronics, Information, and Communication (ICEIC), 20180405. the whole document. 4 pages.
"A ZQ Calibration Method in DDR3 DRAM", 2018; Wang Xiao-Guang, Wang Song, Tan Jie and Li Ji; China Integrated Circuit, Issue 07, China Academic Journal Electronic Publishing House; 4 pages with English abstract.
First Office Action of the Chinese application No. 202010811719.9, dated Mar. 22, 2022. 7 pages with English abstract.
First Office Action of the U.S. Appl. No. 17/474,172, dated Jul. 27, 2023. 25 pages.
International Search Report in the international application No. PCT/CN2020/139373 , dated May 12, 2021. 2 pages.
English translation of the Written Opinion of the International Search Authority in the international application No. PCT/CN2020/139373 , dated May 12, 2021. 4 pages.
Design of High-speed High-reliability Voltage Mode Sense Amplifier, 2010; Wang Yi Ran, Yu Zong Guang and Jia Ze; Computer Technology and Its Applications vol. 2010, No. 5, 5 pages with English abstract.
"Offset-canceling Current-sampling Sense Amplifier for Resistive Nonvolatile Memory in 65 nm CMOS", 2016; Tuehui Na, Byungkyu Song, Jung Pill Kim, Seung H. Kang and Seong-Ook Jung; IEEE Journal of Solid-State Circuits, vol. 52, Issue 2, 9 pages.
The Analysis and Design Based on 65nm SRAM for Low-Offset-Voltage and Self-Activated Sense Amplifier, China Excellent Master's Dissertation Full Text Database & Information Science and Technology Series, vol. 8, 2017, 20170815. pp. 8-54. 69 pages with English abstract.
First Office Action of the Chinese application No. 202010811687.2, dated May 19, 2022. 12 pages with English translation.
Notice of Allowance of the Chinese application No. 202010811687.2, dated Aug. 4, 2022. 6 pages with English translation.
First Office Action of the U.S. Appl. No. 17/441,679, dated Feb. 17, 2022. 16 pages.

\* cited by examiner

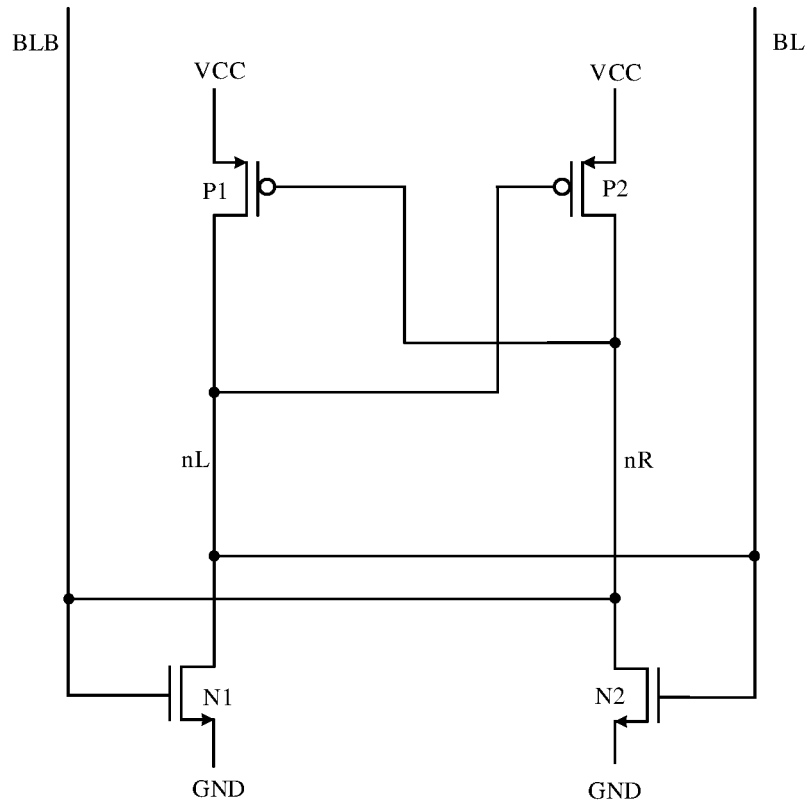

FIG. 15

| When data in a storage unit on a first bit line is read, in a first amplification phase of the sense amplifier, the amplification module is configured to include a first current mirror structure and a mirror terminal of the first current mirror structure is connected to a second bit line by using the control module | — S162 |

| When data in a storage unit on the second bit line is read, in the first amplification phase of the sense amplifier, the amplification module is configured to include a second current mirror structure and a mirror terminal of the second current mirror structure is connected to the first bit line by using the control module | — S164 |

FIG. 16

SENSE AMPLIFIER, MEMORY AND CONTROL METHOD OF SENSE AMPLIFIER

CROSS-REFERENCE TO RELATED APPLICATIONS

This is a continuation application of International Application No. PCT/CN2020/139652, filed on Dec. 25, 2020, which claims priority to Chinese patent application No. 202010902453.9, filed on Sep. 1, 2020, entitled "SENSE AMPLIFIER, MEMORY AND METHOD FOR CONTROLLING SENSE AMPLIFIER". The contents of International Application No. PCT/CN2020/139652 and Chinese patent application No. 202010902453.9 are incorporated herein by reference in their entireties.

TECHNICAL FIELD

The present disclosure relates to the field of semiconductor memory technology, and more particularly, to a sense amplifier, a memory and a method for controlling the sense amplifier.

BACKGROUND

With the popularity of electronic devices such as mobile phones, tablet computers and personal computers, semiconductor memory technology has also developed rapidly. Memories such as a dynamic random access memory (DRAM) and static random-access memory (SRAM) have been widely used in various electronic devices due to advantages of high density, low power consumption, low price and the like.

In the DRAM, each bit line in different storage unit arrays is connected in pairs to a sense amplifier having a bit line BL (read bit line) input terminal and a bit line BLB (reference bit line) input terminal. In a read operation (or refresh operation), the function of the sense amplifier is to obtain a voltage difference between the read bit line BL and the reference bit line BLB and amplify the voltage difference between the two bit lines.

However, when the sense amplifier performs an amplification operation, an abnormality may occur, which leads to an error result of output after amplification and seriously affects the performance of the semiconductor memory.

It should be noted that the information disclosed in the above background section is merely intended to enhance understanding of the context of the present disclosure, and thus may include information that does not constitute the related art known to a person of ordinary skilled in the art.

SUMMARY

The present disclosure aims to provide a sense amplifier, a memory and a method for controlling the sense amplifier, so as to overcome the problem of errors caused in reading data by the sense amplifier at least to some extent.

According to a first aspect of the present disclosure, a sense amplifier is provided, which includes an amplification module and a control module. The amplification module is configured to read data in a storage unit on a first bit line or a second bit line. The control module is electrically connected to the amplification module. When the data in the storage unit on the first bit line is read, in a first amplification phase of the sense amplifier, the control module is configured to configure the amplification module to include a first current mirror structure and connect a mirror terminal of the first current mirror structure to the second bit line. When the data in the storage unit on the second bit line is read, in the first amplification phase of the sense amplifier, the control module is configured to configure the amplification module to include a second current mirror structure and connect a mirror terminal of the second current mirror structure to the first bit line.

In one example, the amplification module includes a first positive channel metal oxide semiconductor (PMOS) transistor, a second PMOS transistor, a first negative channel metal oxide semiconductor (NMOS) transistor and a second NMOS transistor. The first NMOS has a gate connected to the second bit line and a drain connected to a drain of the first PMOS transistor through a first node. The second NMOS transistor has a gate connected to the first bit line and a drain connected to a drain of the second PMOS transistor through a second node. When the data in the storage unit on the first bit line is read, in the first amplification phase of the sense amplifier, the control module is configured to configure the first PMOS transistor and the second PMOS transistor as the first current mirror structure and connect the second bit line to the second node. When the data in the storage unit on the second bit line is read, in the first amplification phase of the sense amplifier, the control module is configured to configure the first PMOS transistor and the second PMOS transistor as the second current mirror structure and connect the first bit line to the first node.

In one example, the control module further includes a first switch, a second switch, a third switch, a fourth switch and a fifth switch. The first switch has a first terminal connected to a gate of the first PMOS transistor and a second terminal connected to a gate of the second PMOS transistor. The second switch has a first terminal connected to the gate of the second PMOS transistor and a second terminal connected to the first node. The third switch has a first terminal connected to the second node and a second terminal connected to the gate of the first PMOS transistor. The fourth switch has a first terminal connected to the second node and a second terminal connected to the second bit line. The fifth switch has a first terminal connected to the first bit line and a second terminal connected to the first node. When the data in the storage unit on the first bit line is read, in the first amplification phase of the sense amplifier, the first switch, the second switch and the fourth switch are closed, and the third switch and the fifth switch are open. When the data in the storage unit on the second bit line is read, in the first amplification phase of the sense amplifier, the first switch, the third switch and the fifth switch are closed, and the second switch and the fourth switch are open.

In one example, in the first amplification phase of the sense amplifier, sources of the first PMOS transistor and the second PMOS transistor receive a first voltage, and sources of the first NMOS transistor and the second NMOS transistor are connected to ground.

In one example, when the data in the storage unit on the first bit line is read, in an offset compensation phase of the sense amplifier, the control module is configured to configure the amplification module to include the first current mirror structure and a first diode structure; and when the data in the storage unit on the second bit line is read, in the offset compensation phase of the sense amplifier, the control module is configured to configure the amplification module to include the second current mirror structure and a second diode structure.

In one example, the control module further includes a sixth switch and a seventh switch. The sixth switch has a first terminal connected to the first node and a second terminal connected to the second bit line. The seventh switch has a first terminal connected to the first bit line and a second terminal connected to the second node. In the first amplification phase of the sense amplifier, the sixth switch and the seventh switch are open. When the data in the storage unit on the first bit line is read, in the offset compensation phase of the sense amplifier, the sixth switch is open and the seventh switch is closed; and when the data in the storage unit on the second bit line is read, in the offset compensation phase of the sense amplifier, the sixth switch is closed and the seventh switch is open.

In one example, in the offset compensation phase of the sense amplifier, the sources of the first PMOS transistor and the second PMOS transistor receive the first voltage, and the sources of the first NMOS transistor and the second NMOS transistor are connected to ground.

In one example, the control module is configured to configure the amplification module as a cross-coupled amplification structure in a second amplification phase after the first amplification phase of the sense amplifier.

In one example, in the second amplification phase of the sense amplifier, the first switch, the sixth switch and the seventh switch are open, and the second switch, the third switch, the fourth switch and the fifth switch are closed.

In one example, in the second amplification phase of the sense amplifier, the sources of the first PMOS transistor and the second PMOS transistor receive the first voltage, and the sources of the first NMOS transistor and the second NMOS transistor are connected to ground.

In one example, there is an inductive phase of the sense amplifier between the offset compensation phase and the first amplification phase of the sense amplifier. When the data in the storage unit on the first bit line is read, in the inductive phase of the sense amplifier, the first switch and the second switch are closed, and the third switch, the fourth switch, the fifth switch, the sixth switch and the seventh switch are open; and when the data in the storage unit on the second bit line is read, in the inductive phase of the sense amplifier, the first switch and the third switch are closed, and the second switch, the fourth switch, the fifth switch, the sixth switch and the seventh switch are open.

In one example, the sense amplifier further includes a precharge module. The precharge module is configured to perform precharge on the first bit line and the second bit line in a precharge phase before the offset compensation phase of the sense amplifier.

In one example, in the precharge phase of the sense amplifier, the sources of the first PMOS transistor, the second PMOS transistor, the first NMOS transistor and the second PMOS transistor all receive a second voltage.

According to a second aspect of the present disclosure, a memory is provided, which includes the sense amplifier as described in any one of the above.

According to a third aspect of the present disclosure, a method for controlling a sense amplifier is provided, and the sense amplifier includes an amplification module and a control module. The method for controlling the sense amplifier includes the following operations. When data in a storage unit on a first bit line is read, in a first amplification phase of the sense amplifier, the control module configures the amplification module to include a first current mirror structure and connects a mirror terminal of the first current mirror structure to a second bit line. When data in a storage unit on the second bit line is read, in the first amplification phase of the sense amplifier, the control module configures the amplification module to include a second current mirror structure and connects a mirror terminal of the second current mirror structure to the first bit line.

In one example, when the data in the storage unit on the first bit line is read, in an offset compensation phase of the sense amplifier, the control module configures the amplification module to include the first current mirror structure and a first diode structure; and when the data in the storage unit on the second bit line is read, in the offset compensation phase of the sense amplifier, the control module configures the amplification module to include the second current mirror structure and a second diode structure.

In the technical solutions provided by some embodiments of the present disclosure, under control of the control module, when the data in the storage unit on the first bit line is read, in the first amplification phase of the sense amplifier, the amplification module is configured to include the first current mirror structure and the mirror terminal of the first current mirror structure is connected to the second bit line; and when the data in the storage unit on the second bit line is read, in the first amplification phase of the sense amplifier, the amplification module is configured to include the second current mirror structure and the mirror terminal of the second current mirror structure is connected to the first bit line. Based on circuit configuration of the present disclosure, it is possible to pre-amplify a non-read bit line voltage in a opposite direction during the first amplification phase, so as to ensure that a voltage on the first bit line and a voltage on the second bit line can be effectively distinguished and amplified in the second amplification phase, thereby improving the accuracy of data reading and further improving the performance of the semiconductor memory.

It is to be understood that the above general description and the detailed description below are merely exemplary and explanatory, and the present disclosure is not limited thereto.

BRIEF DESCRIPTION OF THE DRAWINGS

The accompanying drawings herein are incorporated in and constitute a part of the present specification, illustrate embodiments conforming to the present disclosure and, together with the description, serve to explain the principles of the present disclosure. It is apparent that the accompanying drawings in the description below are merely some embodiments of the present disclosure, and those skilled in the art can obtain other accompanying drawings from these accompanying drawings without creative work.

FIG. 15 schematically illustrates a circuit diagram of a sense amplifier in a second amplification phase when data in a storage unit on a second bit line is read according to an embodiment of the present disclosure.

FIG. 16 schematically illustrates a flowchart of a method for controlling a sense amplifier according to an exemplary implementation of the present disclosure.

DETAILED DESCRIPTION

Figure 1:
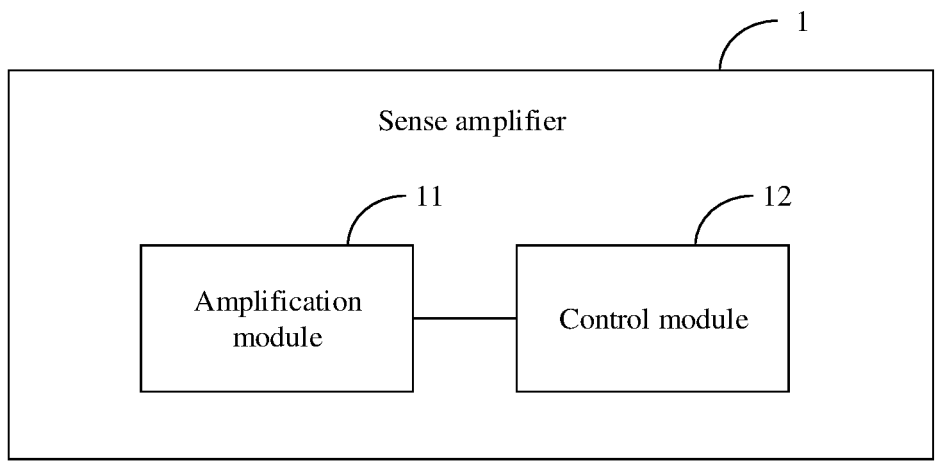
FIG. 1 schematically illustrates a block diagram of a sense amplifier according to an exemplary implementation of the present disclosure.

Example implementations will now be described more fully with reference to the accompanying drawings. However, the example implementations can be implemented in various forms and should not be construed as being limited to the examples set forth herein. In contrary, these implementations are provided so that the present disclosure will be more comprehensive and complete, and will fully convey the conceptions of the exemplary implementations to those skilled in the art. The described features, structures or characteristics may be combined in one or more implementations in any suitable manner. In the description below, numerous specific details are provided to give a sufficient understanding of the implementations of the present disclosure. However, those skilled in the art will appreciate that the technical solutions of the present disclosure can be practiced while one or more of the specific details are omitted, or other methods, components, devices, steps, and the like may be employed. In other cases, the well-known technical solutions are not illustrated or described in detail to avoid superseding what really counts, which cause aspects of the present disclosure to become obscure.

In addition, the accompanying drawings are merely schematic illustrations of the present disclosure and are not necessarily drawn to scale. The same reference numerals in the figures indicate the same or similar parts, and therefore repeated descriptions thereof will be omitted. The description of "first", "second", "third", "fourth", "fifth", "sixth" and "seventh" are for the purpose of distinction only and should not limit the present disclosure.

It is to be noted that the term "connection", as used in the present disclosure, may include direct connection and indirect connection. In the direct connection, there are no components between the terminals. For example, a first terminal of a switch A is connected to a first terminal of a switch B, which may indicate that there may be only a connection line (e.g., metal line) on the connection between the first terminal of the switch A and the first terminal of the switch B without other components. In the indirect connection, there may be other components between the terminals. For example, a first terminal of a switch C is connected to a first terminal of a switch D, which may indicate that there may be at least one other component (e.g., a switch E, etc.), in addition to the connection line, on the connection between the first terminal of the switch C and the first terminal of the switch D.

In the sense amplifier, a size, mobility, threshold voltage of the transistors may be different due to differences in manufacturing processes and influences of the operation environment, and the performance of each transistor is usually not exactly the same, which causes offset of the sense amplifier (corresponding to the offset noise), and seriously affects the accuracy of data reading by a memory.

For example, the sense amplifier includes two NMOS transistors symmetrically configured. Ideally, the performance of the two NMOS transistors is expected to be exactly the same. However, in practice, the threshold voltages of the two NMOS transistors may be different, which may cause the circuit offset. In such case, if no measure is taken, it is possible to read an originally stored "1" as an error output "0" or read an originally stored "0" as an error output "1" when data is read from a storage unit.

In addition, before the sense amplifier amplifies a voltage on a bit line, there may be a problem that a voltage difference between two bit lines is small. In this case, the influence of amplifying one side to 0 and amplifying the other side to 1 may not be achieved after amplification, which may result in the problem of readout data error and seriously affect the performance of the semiconductor memory.

In view of the above technical problems, the present disclosure provides a new sense amplifier.

FIG. 1 schematically illustrates a block diagram of a sense amplifier according to an exemplary implementation of the present disclosure. As illustrated in FIG. 1, the sense amplifier 1 may include an amplification module 11 and a control module 12.

The amplification module 11 is configured to read data in a storage unit on a first bit line or a second bit line.

The control module 12 is electrically connected to the amplification module 11.

When the data in the storage unit on the first bit line is read, in a first amplification phase of the sense amplifier, the control module 12 is configured to configure the amplification module 11 to include a first current mirror structure and connect a mirror terminal of the first current mirror structure to the second bit line.

When the data in the storage unit on the second bit line is read, in the first amplification phase of the sense amplifier, the control module 12 is configured to configure the amplification module 11 to include a second current mirror structure and connect a mirror terminal of the second current mirror structure to the first bit line.

It is to be readily understood by those skilled in the art that the current mirror structure may include a source terminal and a mirror terminal. In structure, the source terminal may be a terminal corresponding to a diode connection mode in a current mirror structure, or it may also be understood that the source terminal is directly connected to the diode structure. The mirror terminal may be a terminal corresponding to a non-diode connection mode in the current mirror structure, or it may also be understood that the mirror terminal is not directly connected to the diode structure.

In addition, it should be noted that the first current mirror structure differs from the second current mirror structure at least on the circuit configuration.

Based on the circuit configuration of the present disclosure, it is able to pre-amplify a non-read bit line voltage in a opposite direction in the first amplification phase, so as to ensure that a voltage on the first bit line and a voltage on the second bit line can be effectively distinguished and amplified in the second amplification phase, thereby improving the accuracy of data reading and further improving the performance of the semiconductor memory.

In some embodiments of the present disclosure, the influence on bit line voltages at the both sides of the sense amplifier due to the offset noise may be compensated, thereby further improving the performance of the semiconductor memory.

It should be understood that the offset noise described in the present disclosure refers to a voltage difference generated by an inconsistency between at least two transistors (or components) in the amplification module 11. In a case of integrating voltage differences among all transistors (or components), the offset noise refers to the offset noise of the entire amplification module 11.

The amplification module 11 may include a first PMOS transistor (hereinafter referred to as transistor P1), a second PMOS transistor (hereinafter referred to as transistor P2), a first NMOS transistor (hereinafter referred to as transistor N1) and a second NMOS transistor (hereinafter referred to as transistor N2).

In this case, the offset noise may be an offset voltage of the transistor P1 and the transistor P2, or may be an offset voltage of the transistor N1 and the transistor N2, or may also be an offset voltage combined with the both, which is not limited in the present disclosure.

Figure 2:
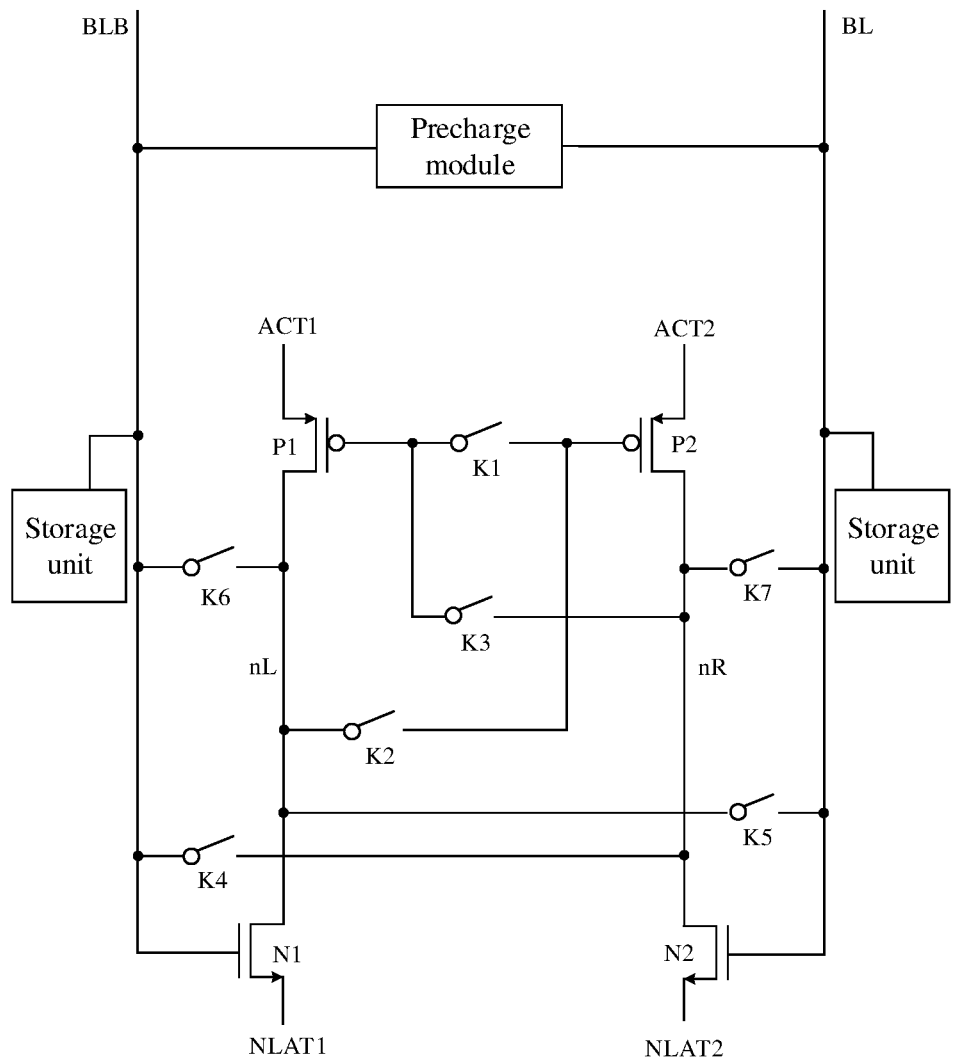
FIG. 2 schematically illustrates a circuit diagram of a sense amplifier according to an exemplary implementation of the present disclosure.

FIG. 2 schematically illustrates a circuit diagram of a sense amplifier according to an exemplary implementation of the present disclosure.

Referring to FIG. 2, a drain of the transistor P1 is connected to a drain of the transistor N1, and a drain of the transistor P2 is connected to a drain of the transistor N2. In addition, a gate of the transistor N1 is connected to a second bit line BLB, and a gate of the transistor N2 is connected to a first bit line BL.

For convenience of subsequent description, a first node nL and a second node nR may be defined in the sense amplifier. The drain of the transistor P1 and the drain of the transistor N1 are connected to the first node nL, and the drain of the transistor P2 and the drain of the transistor N2 are connected to the second node nR.

The operation phase of the sense amplifier of the exemplary implementations of the present disclosure may be divided into: a precharge phase, an offset compensation phase, a first amplification phase and a second amplification phase.

In one embodiment, there is an inductive phase (or voltage inductive phase) between the offset compensation phase and the first amplification phase.

When data in a storage unit on the first bit line BL is read, in the first amplification phase of the sense amplifier, the transistor P1 and the transistor P2 are configured as a first current mirror structure and the second bit line BLB is connected to the second node nR.

When data in a storage unit on the second bit line BLB is read, in the first amplification phase of the sense amplifier, the transistor P1 and the transistor P2 are configured as a second current mirror structure and the first bit line BL is connected to the first node nL.

The exemplary implementations of the present disclosure implement the above configuration by the control module. Referring to FIG. 2, the control module may include a first switch (hereinafter referred to as switch K1), a second switch (hereinafter referred to as switch K2), a third switch (hereinafter referred to as switch K3), a fourth switch (hereinafter referred to as switch K4) and a fifth switch (hereinafter referred to as switch K5).

A first terminal of the switch K1 is connected to a gate of the transistor P1 and a second terminal of the switch K1 is connected to a gate of the transistor P2. A first terminal of the switch K2 is connected to the gate of the transistor P2 and a second terminal of the switch K2 is connected to the first node nL. A first terminal of the switch K3 is connected to the second node nR and a second terminal of the switch K3 is connected to the gate of the transistor P1. A first terminal of the switch K4 is connected to the second node nR and a second terminal of the switch K4 is connected to the second bit line BLB. A first terminal of the switch K5 is connected to the first bit line BL and a second terminal of the switch K5 is connected to the first node nL.

When the data in the storage unit on the first bit line BL is read, in the first amplification phase of the sense amplifier, the switch K1, the switch K2 and the switch K4 are closed, and the switch K3 and the switch K5 are open.

When the data in the storage unit on the second bit line BLB is read, in the first amplification phase of the sense amplifier, the switch K1, the switch K3 and the switch K5 are closed, and the switch K2 and the switch K4 are open.

Corresponding to the above description, when the data in the storage unit on the first bit line BL is read, in the first amplification phase of the sense amplifier, since the switch K1 and the switch K2 are closed, the transistor P1 and the transistor P2 form the first current mirror structure. A source terminal of the first current mirror structure may be the first node nL and a mirror terminal of the first current mirror structure may be the second node nR.

When the data in the storage unit on the second bit line BLB is read, in the first amplification phase of the sense amplifier, since the switch K1 and the switch K3 are closed, the transistor P1 and the transistor P2 form the second current mirror structure. A source terminal of the second current mirror structure may be the second node nR and a mirror terminal of the second current mirror structure may be the first node nL.

The present disclosure does not limit the types of the switch K1, the switch K2, the switch K3, the switch K4 and the switch K5. For example, the switch K1 may be a PMOS transistor, an NMOS transistor or a CMOS transmission gate; the switch K2 may be a PMOS transistor, an NMOS transistor or a CMOS transmission gate; the switch K3 may be a PMOS transistor, an NMOS transistor or a CMOS transmission gate; the switch K4 may be a PMOS transistor, an NMOS transistor or a CMOS transmission gate; and the switch K5 may be a PMOS transistor, an NMOS transistor or a CMOS transmission gate.

In some embodiments of the present disclosure, the switch K1 may include a control terminal, which is configured to control a switching state of the switch K1 responsive to a first control signal (denoted as control signal S1). The switch K2 may also include a control terminal, which is configured to control a switching state of the switch K2 responsive to a second control signal (denoted as control signal S2). The switch K3 may also include a control terminal, which is configured to control a switching state of the switch K3 responsive to a third control signal (denoted as control signal S3). The switch K4 may also include a control terminal, which is configured to control a switching state of the switch K4 responsive to a fourth control signal (denoted as control signal S4). The switch K5 may also include a control terminal, which is configured to control a switching state of the switch K5 responsive to a fifth control signal (denoted as control signal S5).

In addition, a source of the transistor P1 may receive a control signal ACT1, a source of the transistor P2 may receive a control signal ACT2, a source of the transistor N1 may receive a control signal NLAT1, and a source of the transistor N2 may receive a control signal NLAT2.

In some embodiments of the present disclosure, the source of the transistor P1 and the source of the transistor P2 may be connected, that is, the control signal ACT1 is the same as the control signal ACT2. The source of the transistor N1 and the source of the transistor N2 may be connected, that is, the control signal NLAT1 is the same as the control signal NLAT2.

In the first amplification phase of the sense amplifier, the sources of the transistor P1 and the transistor P2 both receive a first voltage. The first voltage may be a supply voltage VCC. That is, in this phase, the control signal ACT1 and the control signal ACT2 both are configured as the first voltage.

In this phase, the sources of the transistor N1 and the transistor N2 are connected to ground (GND). That is, voltages received by the control signal NLAT1 and the control signal NLAT2 is 0.

When the data in the storage unit on the first bit line BL is read, in an offset compensation phase of the sense amplifier, the control module is configured to configure the amplification module to include the first current mirror structure described above and a first diode structure.

When the data in the storage unit on the second bit line BLB is read, in the offset compensation phase of the sense amplifier, the control module is configured to configure the amplification module to include the second current mirror structure described above and a second diode structure.

The second diode structure differs from the first diode structure at least on the circuit configuration. Specifically, the transistor N2 may be configured as the first diode structure described above, and the transistor N1 may be configured as the second diode structure described above.

In this case, referring to FIG. 2, the sense amplifier of the present disclosure may further include a sixth switch (hereinafter referred to as switch K6) and a seventh switch (hereinafter referred to as switch K7).

A first terminal of the switch K6 is connected to the first node nL and a second terminal of the switch K6 is connected to the second bit line BLB. A first terminal of the switch K7 is connected to the first bit line BL and a second terminal of the switch K7 is connected to the second node nR.

Similarly, the present disclosure does not limit the types of the switch K6 and the switch K7. For example, the switch K6 may be a PMOS transistor, an NMOS transistor or a CMOS transmission gate, and the switch K7 may be a PMOS transistor, an NMOS transistor or a CMOS transmission gate.

In some embodiments of the present disclosure, the switch K6 may include a control terminal, which is configured to control a switching state of the switch K6 responsive to a sixth control signal (denoted as control signal S6). The switch K7 may also include a control terminal, which is configured to control a switching state of the switch K7 responsive to a seventh control signal (denoted as control signal S7).

In the first amplification phase of the sense amplifier, the switch K6 and the switch K7 are open.

When the data in the storage unit on the first bit line BL is read, in the offset compensation phase of the sense amplifier, the switch K6 is open and the switch K7 is closed. When the data in the storage unit on the second bit line BLB is read, in the offset compensation phase of the sense amplifier, the switch K6 is closed and the switch K7 is open.

In addition, in the offset compensation phase of the sense amplifier, the sources of the transistor P1 and the transistor P2 receive the first voltage, and the sources of the transistor N1 and the transistor N2 are connected to ground.

The control module is configured to configure the amplification module as a cross-coupled amplification structure in a second amplification phase after the first amplification phase of the sense amplifier.

Specifically, in the second amplification phase, the switch K1, the switch K6 and the switch K7 are open, and the switch K2, the switch K3, the switch K4 and the switch K5 are closed. Further, the sources of the transistor P1 and the transistor P2 receive the first voltage, that is, the control signal ACT1 and the control signal ACT2 are VCC. The sources of the transistor N1 and the transistor N2 are connected to ground, that is, the control signal NLAT1 and the control signal NLAT2 are zero.

In some embodiments of the present disclosure, there is the inductive phase of the sense amplifier between the offset compensation phase and the first amplification phase of the sense amplifier.

When the data in the storage unit on the first bit line BL is read, in the inductive phase of the sense amplifier, the switch K1 and the switch K2 are closed, and the switch K3, the switch K4, the switch K5, the switch K6 and the switch K7 are open.

When the data in the storage unit on the second bit line BLB is read, in the inductive phase of the sense amplifier, the switch K1 and the switch K3 are closed, and the switch K2, the switch K4, the switch K5, the switch K6 and the switch K7 are open.

In addition, the sense amplifier further includes a precharge module, which is configured to perform precharge on the first bit line BL and the second bit line BLB in a precharge phase before the offset compensation phase of the sense amplifier.

In the precharge phase, the sources of the transistor P1, the transistor P2, the transistor N1 and the transistor N2 all receive a second voltage. The second voltage is less than the first voltage. In one example, the second voltage may be VCC/2.

In addition, when it is ensured that the first bit line BL and the second bit line BLB is enabled to be precharged, one or more of the switch K1, the switch K2, the switch K3, the switch K4, the switch K5, the switch K6 and the switch K7 may be in a closed state, and the present disclosure is not limited thereto.

Figure 3:
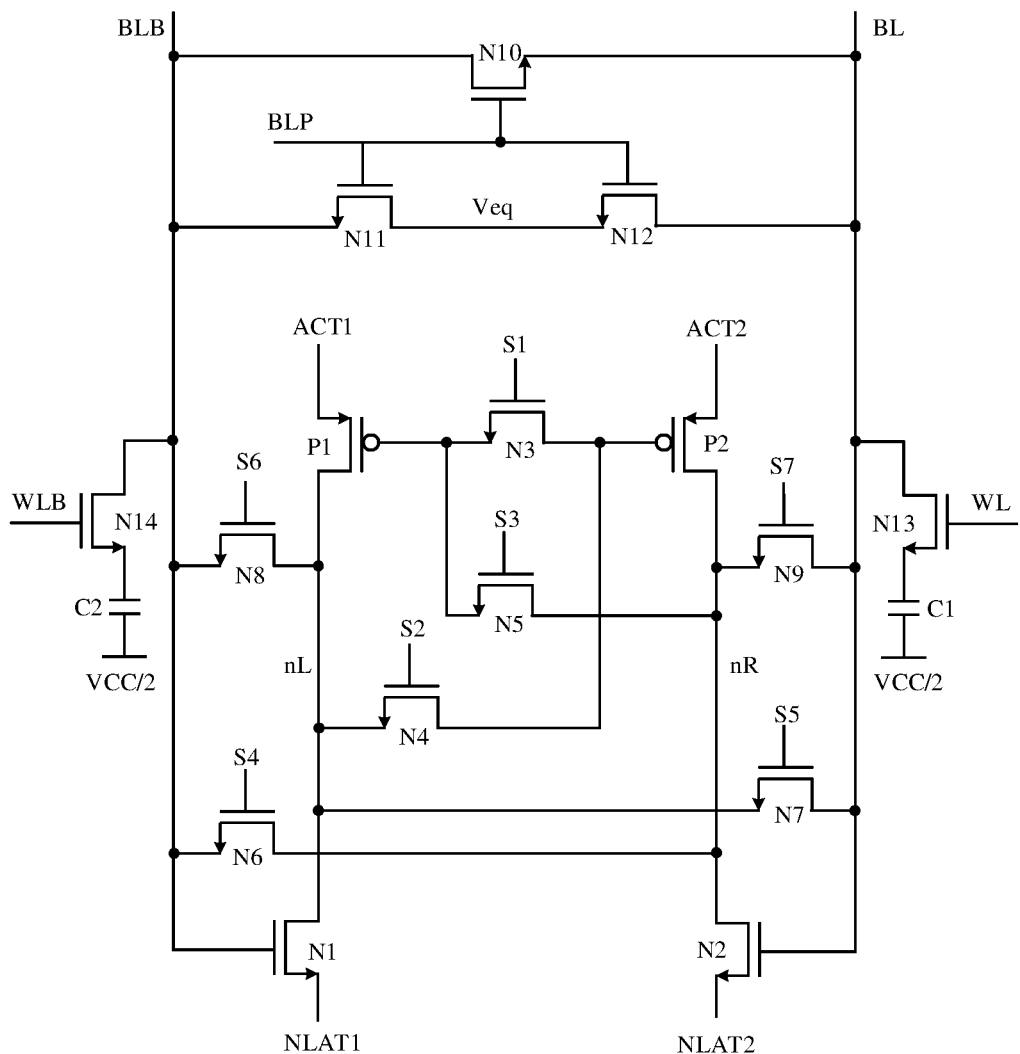
FIG. 3 schematically illustrates a circuit diagram of a specific configuration of a sense amplifier according to an embodiment of the present disclosure.

FIG. 3 schematically illustrates a circuit diagram of a sense amplifier according to an embodiment of the present disclosure.

In the embodiment illustrated in FIG. 3, the switch K1 is configured as a transistor N3 to control the switching state responsive to the control signal S1; the switch K2 is configured as a transistor N4 to control the switching state responsive to the control signal S2; the switch K3 is configured as a transistor N5 to control the switching state responsive to the control signal S3; the switch K4 is configured as a transistor N6 to control the switching state responsive to the control signal S4; the switch K5 is configured as a transistor N7 to control the switching state responsive to the control signal S5; the switch K6 is configured as a transistor N8 to control the switching state responsive to the control signal S6; and the switch K7 is configured as a transistor N9 to control the switching state responsive to the control signal S7.

The precharge module may include a transistor N10, a transistor N11 and a transistor N12.

Gates of the transistor N10, the transistor N11 and the transistor N12 may all receive a precharge control signal BLP. A source of the transistor N10 is connected to the first bit line BL and a drain of the transistor N10 is connected to the second bit line BLB. A source of the transistor N11 is connected to the second bit line BLB and a drain of the transistor N11 is connected to a source of the transistor N12 and connected to a precharge voltage Veq. The precharge voltage Veq may be configured as VCC/2. A drain of the transistor N12 is connected to the first bit line BL.

A storage unit corresponding to the first bit line BL is configured to include a transistor N13 and a capacitor C1, and the transistor N13 controls a switching state responsive to a word line control signal WL. A storage unit corresponding to the second bit line BLB is configured to include a transistor N14 and a capacitor C2, and the transistor N14 controls a switching state responsive to a word line control signal WLB.

A process of reading the data on the first bit line BL and a process of reading the data on the second bit line BLB will be described below, respectively.

Figure 4:
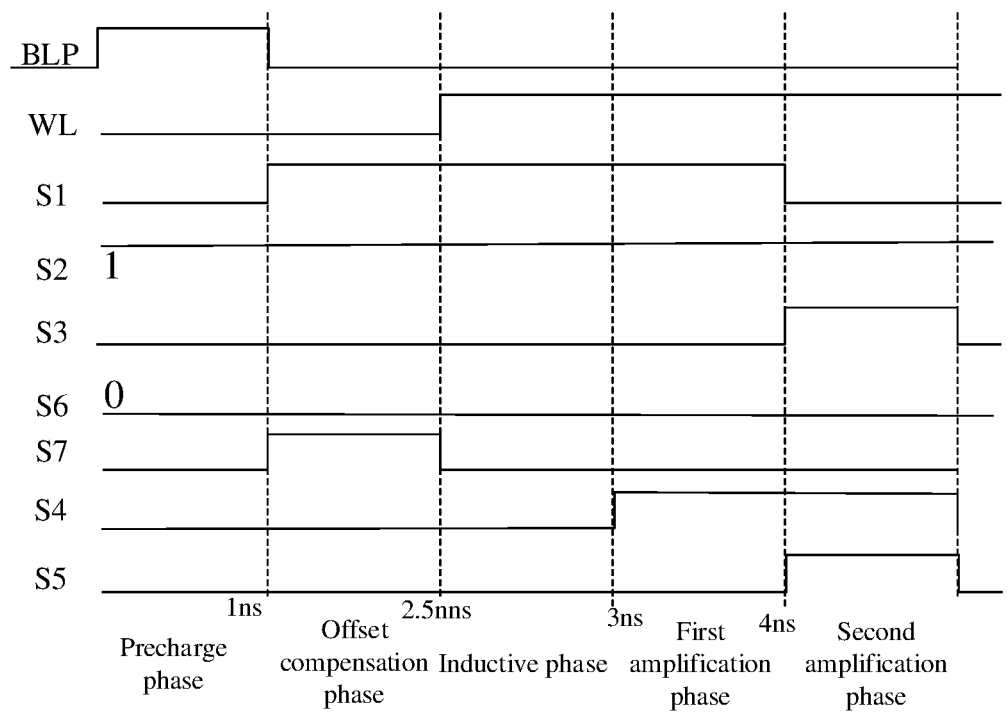
FIG. 4 schematically illustrates a timing diagram of various control signals involved in a sense amplifier when data in a storage unit on a first bit line is read according to an embodiment of the present disclosure.

FIG. 4 schematically illustrates a timing diagram of various control signals involved in a sense amplifier when data in a storage unit on the first bit line BL is read according to an embodiment of the present disclosure.

The operation phase of the sense amplifier when the data in the storage unit on the first bit line BL is read according to the embodiments of the present disclosure will be described with reference to the timing diagram of FIG. 4.

Figure 5:
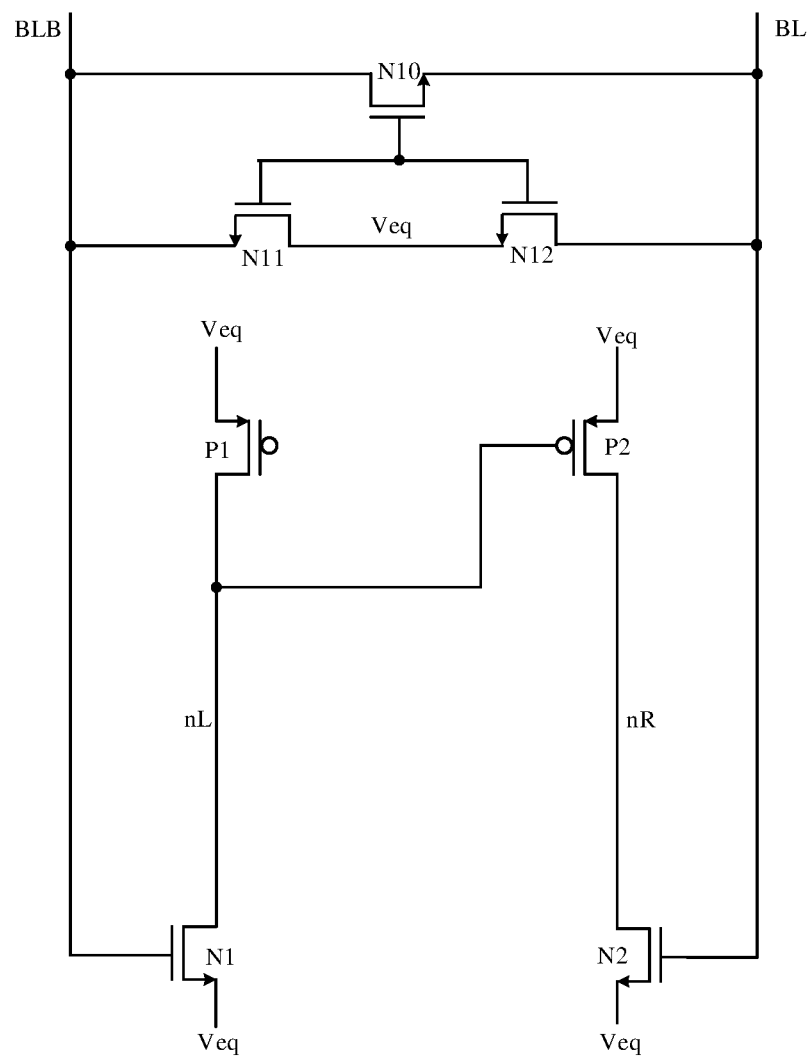
FIG. 5 schematically illustrates a circuit diagram of a sense amplifier in a precharge phase when data in a storage unit on a first bit line is read according to an embodiment of the present disclosure.

FIG. 5 is directed to the precharge phase of the sense amplifier when the data in the storage unit on the first bit line BL is read. The precharge control signal BLP and the control signal S2 are high levels and the remaining control signals are low levels.

Correspondingly, the transistor N10, the transistor N11, the transistor N12 and the transistor N4 are on (corresponding to the closed state of the switch), and the transistor N3, the transistor N5, the transistor N6, the transistor N7, the transistor N8 and the transistor N9 are off (corresponding to the open state of the switch).

In this case, the first bit line BL and the second bit line BLB are connected to the precharge voltage Veq through the transistor N11 and the transistor N12, respectively, and are connected to each other through the transistor N10, so that the first bit line BL and the second bit line BLB are precharged to Veq.

In addition, it is to be noted that when it is ensured that the first bit line BL and the second bit line BLB are enabled to be precharged, one or more of the transistor N3, the transistor N4, the transistor N5, the transistor N6, the transistor N7, the transistor N8 and the transistor N9 may be on, and the present disclosure is not limited thereto.

Figure 6:
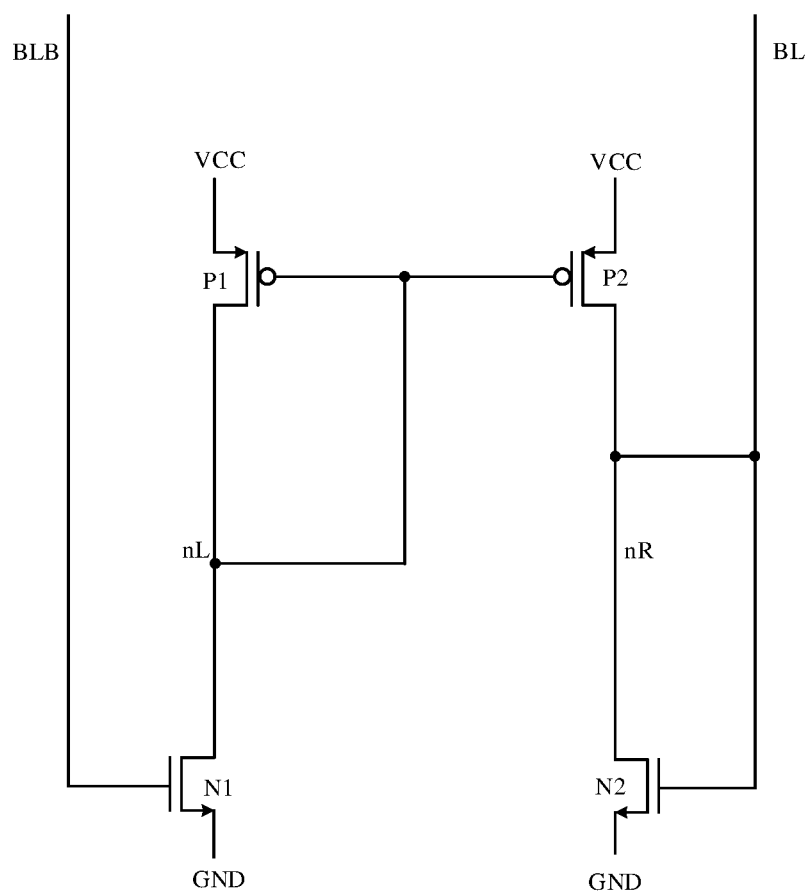
FIG. 6 schematically illustrates a circuit diagram of a sense amplifier in an offset compensation phase when data in a storage unit on a first bit line is read according to an embodiment of the present disclosure.

FIG. 6 is directed to the offset compensation phase of the sense amplifier when the data in the storage unit on the first bit line BL is read. In the offset compensation phase, the control signal S1, the control signal S2 and the control signal S7 are high levels, and the remaining control signals are low levels.

Correspondingly, the transistor N3, the transistor N4 and the transistor N9 are on, and the transistor N5, the transistor N6, the transistor N7 and the transistor N8 are off.

In this case, the precharge voltage enters the sense amplifier through the transistor N9. Based on the current mirror structure composed of the transistor P1 and the transistor P2, the current on a branch composed of the transistor P1 and the transistor N1 is equal to that on a branch composed of the transistor P2 and the transistor N2, thereby reducing the influence of the offset noise on the circuit.

Figure 7:
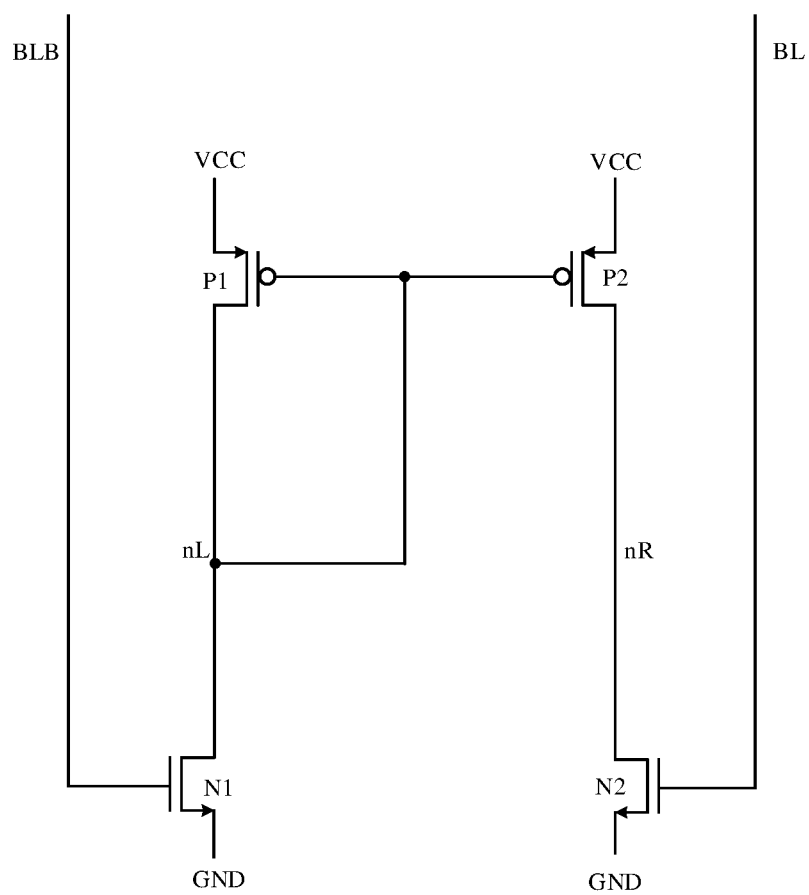
FIG. 7 schematically illustrates a circuit diagram of a sense amplifier in an inductive phase when data in a storage unit on a first bit line is read according to an embodiment of the present disclosure.

FIG. 7 is directed to the inductive phase of the sense amplifier when the data in the storage unit on the first bit line BL is read. In the inductive phase, the control signal S1 and the control signal S2 are high levels, and the transistor N3 and the transistor N4 are on. Through the induction phase, the charge situation on the two branches tends to be stable.

It is to be appreciated that in some embodiments of the present disclosure, there may be no induction phase in the operation phase of the sense amplifier. That is, after the offset compensation phase, it is possible to directly enter the first amplification phase.

Figure 8:
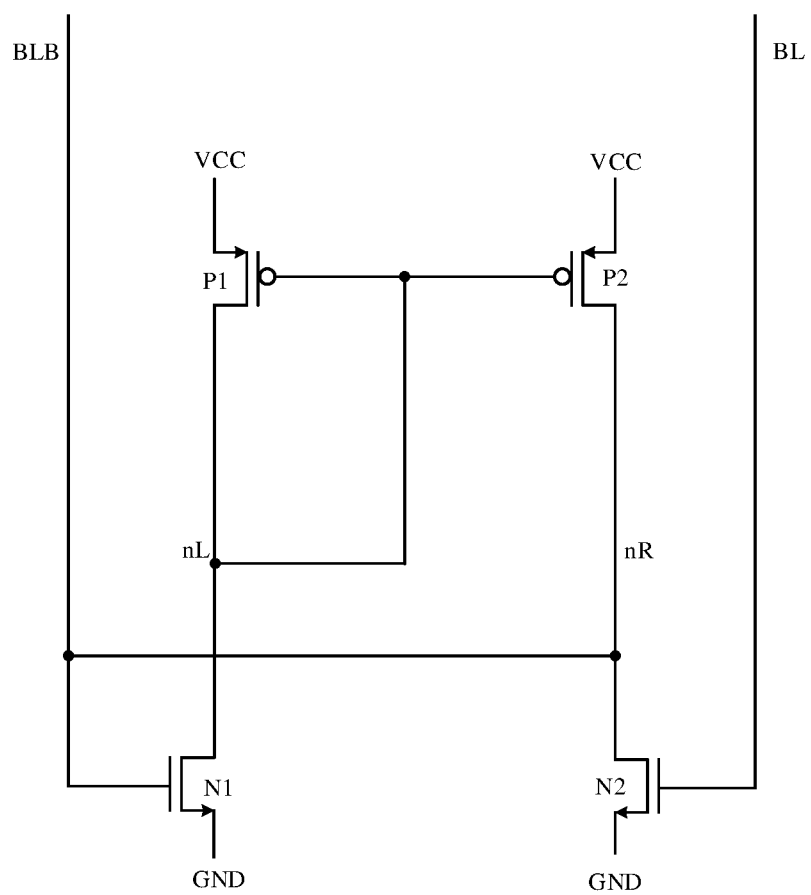
FIG. 8 schematically illustrates a circuit diagram of a sense amplifier in a first amplification phase when data in a storage unit on a first bit line is read according to an embodiment of the present disclosure.

FIG. 8 is directed to the first amplification phase of the sense amplifier when the data in the storage unit on the first bit line BL is read. The control signal S1, the control signal S2 and the control signal S4 are high levels, and the word line control signal WL is in the on state.

Correspondingly, the transistor N3, the transistor N4 and the transistor N6 are on, and the transistor N5, the transistor N7, the transistor N8 and the transistor N9 are off.

When "1" is read for the first bit line BL, a gate voltage of the transistor N2 increases, conduction capability is improved and a drain voltage decreases. Since the drain is connected to the second bit line BLB, the voltage on the second bit line BLB decreases. Therefore, the purpose of controlling the non-read bit line voltage to be pre-amplified in the opposite direction is achieved, the voltage difference between the first bit line BL and the second bit line BLB is increased, thereby facilitating the subsequent process for amplifying the voltages of the first bit line BL and the second bit line BLB.

When "0" is read for the first bit line BL, the gate voltage of the transistor N2 decreases. In this case, the drain voltage increases, that is, the voltage of the second bit line BLB is pulled high. Thus, the purpose of increasing the voltage difference between the first bit line BL and the second bit line BLB is also achieved, thereby facilitating the subsequent process for amplifying the voltages of the first bit line BL and the second bit line BLB.

Figure 9:
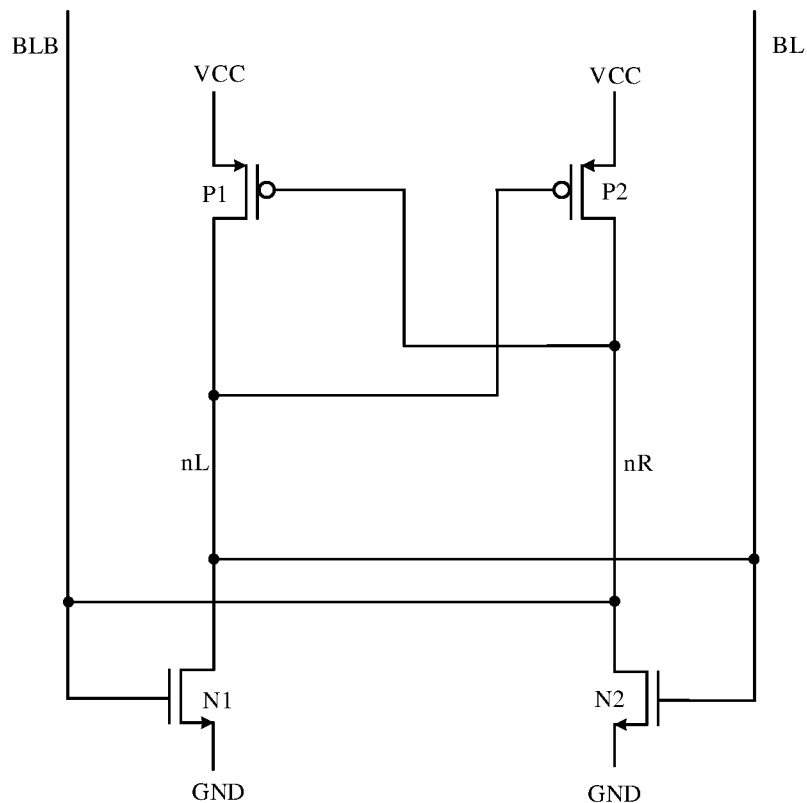
FIG. 9 schematically illustrates a circuit diagram of a sense amplifier in a second amplification phase when data in a storage unit on a first bit line is read according to an embodiment of the present disclosure.

FIG. 9 is directed to the second amplification phase of the sense amplifier when the data in the storage unit on the first bit line BL is read. The control signal S2, the control signal S3, the control signal S4 and the control signal S5 are high levels. Correspondingly, the transistor N4, the transistor N5, the transistor N6 and the transistor N7 are on, and the transistor N3, the transistor N8 and the transistor N9 are off.

Thus, the transistor P1, the transistor P2, the transistor N1 and the transistor N2 constitute the cross-coupled amplification structure.

When "1" is read for the first bit line BL, the voltage on the first bit line BL is higher than the voltage on the second bit line BLB. At this time, the transistor N2 and the transistor N6 are on, and the voltage on the second bit line BLB can be discharged to ground (GND) through the transistor N2. In addition, the transistor P1 is on, and the voltage on the first bit line BL can be increased to VCC.

When "0" is read for the first bit line BL, the voltage on the first bit line BL is lower than the voltage on the second bit line BLB. At this time, the transistor N1 and the transistor N7 are on, and the voltage on the first bit line BL can be discharged to ground (GND) through the transistor N1. In addition, the transistor P2 is on, and the voltage on the second bit line BLB can be increased to VCC.

Through the cross-coupled amplification structure, the purpose of amplifying a small voltage difference read by the bit line from the storage unit to full swing (0 or 1) may be achieved.

Figure 10:
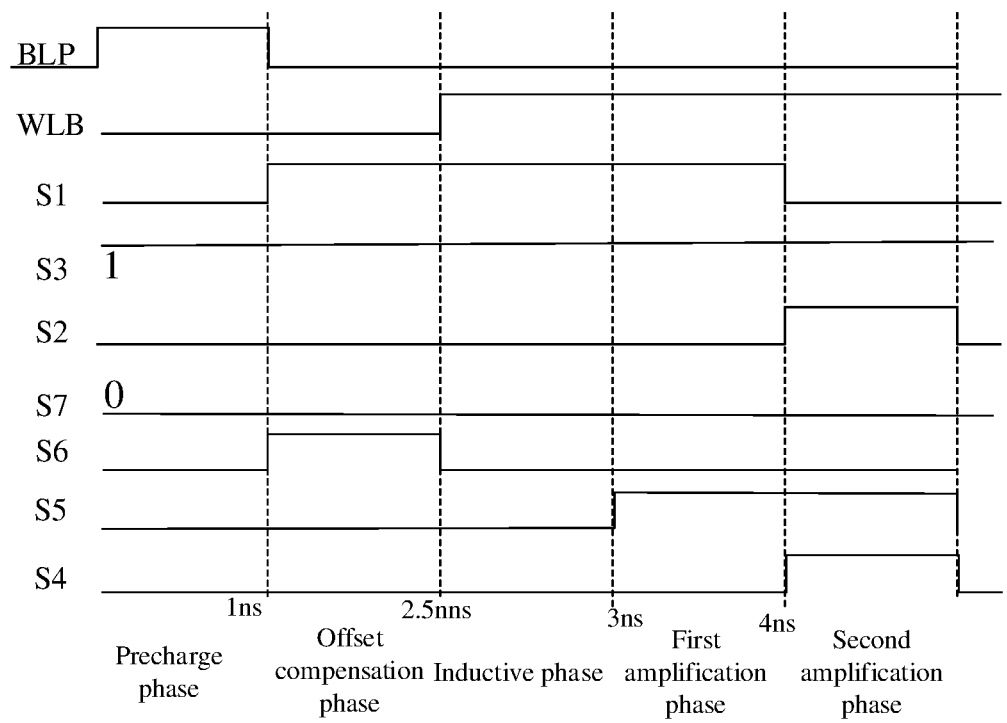
FIG. 10 schematically illustrates a timing diagram of various control signals involved in a sense amplifier when data in a storage unit on a second bit line is read according to an embodiment of the present disclosure.

FIG. 10 schematically illustrates a timing diagram of various control signals involved in a sense amplifier when data in a storage unit on a second bit line BLB is read according to an embodiment of the present disclosure.

The operation phase of the sense amplifier when the data in the storage unit on the second bit line BLB is read according to the embodiments of the present disclosure will be described below with reference to the timing diagram of FIG. 10.

Figure 11:
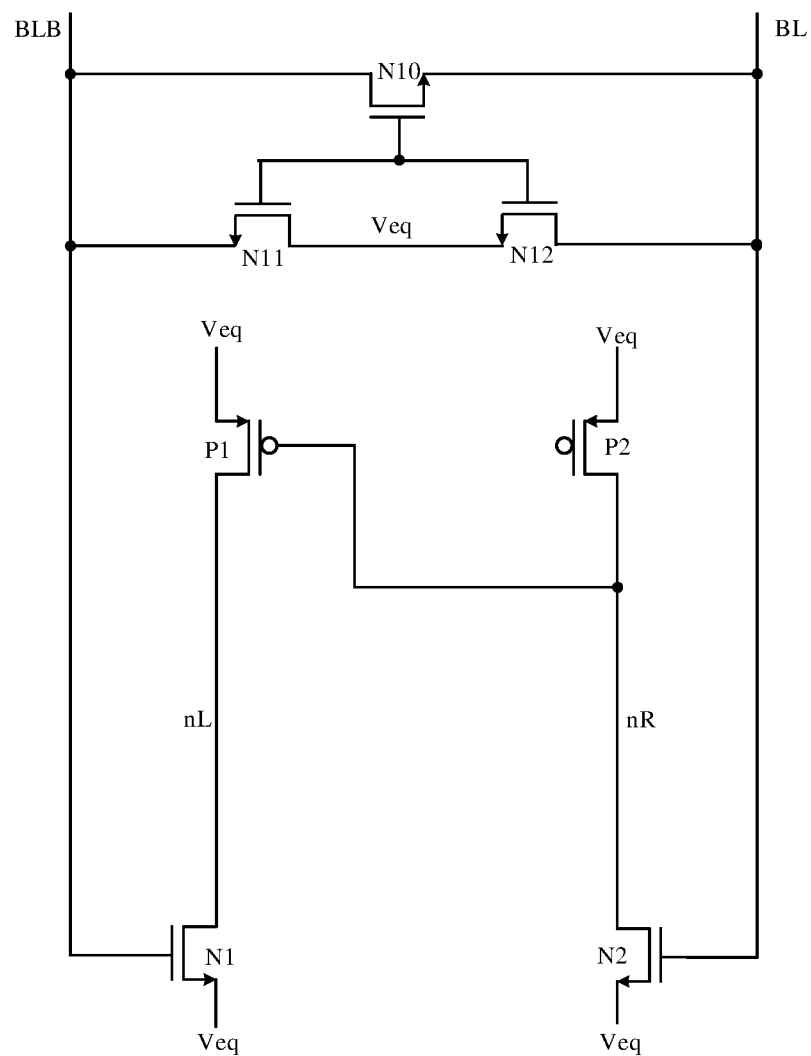
FIG. 11 schematically illustrates a circuit diagram of a sense amplifier in a precharge phase when data in a storage unit on a second bit line is read according to an embodiment of the present disclosure.

FIG. 11 is directed to the precharge phase of the sense amplifier when the data in the storage unit on the second bit line BLB is read. The precharge control signal BLP and the control signal S3 are high levels and the remaining control signals are low levels.

Correspondingly, the transistor N10, the transistor N11, the transistor N12 and the transistor N5 are on, and the transistor N3, the transistor N4, the transistor N6, the transistor N7, the transistor N8 and the transistor N9 are off.

In this case, the first bit line BL and the second bit line BLB are connected to the precharge voltage Veq through the transistor N11 and the transistor N12, respectively, and are connected to each other through the transistor N10, so that the first bit line BL and the second bit line BLB are precharged to Veq.

In addition, it is to be noted that when it is ensured that the first bit line BL and the second bit line BLB is enabled to be precharged, one or more of the transistor N3, the transistor N4, the transistor N5, the transistor N6, the transistor N7, the transistor N8 and the transistor N9 may be in the off state, and the present disclosure is not limited thereto.

Figure 12:
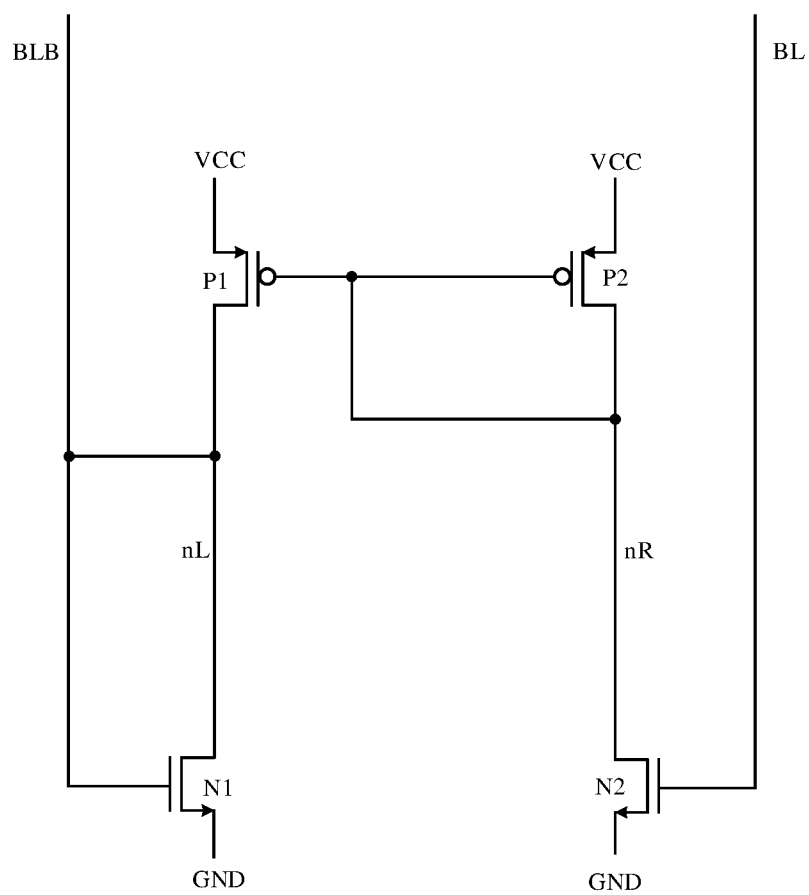
FIG. 12 schematically illustrates a circuit diagram of a sense amplifier in an offset compensation phase when data in a storage unit on a second bit line is read according to an embodiment of the present disclosure.

FIG. 12 is directed to the offset compensation phase of the sense amplifier when the data in the storage unit on the second bit line BLB is read. The control signal S1, the control signal S3 and the control signal S6 are high levels, and the remaining control signals are low levels.

Correspondingly, the transistor N3, the transistor N5 and the transistor N8 are on, and the transistor N4, the transistor N6, the transistor N7 and the transistor N9 are off.

In this case, the precharge voltage enters the sense amplifier through the transistor N8. Based on the current mirror structure composed of the transistor P1 and the transistor P2, the current on the branch composed of the transistor P1 and the transistor N1 is equal to that on the branch composed of the transistor P2 and the transistor N2, thereby reducing the influence of offset noise on the circuit.

In addition, it is to be appreciated by those skilled in the art that when the data in the storage unit on the second bit line BLB is read, offset compensation may also be implemented using the circuit configuration as illustrated in FIG. 6, and the present disclosure is not limited thereto.

Figure 13:
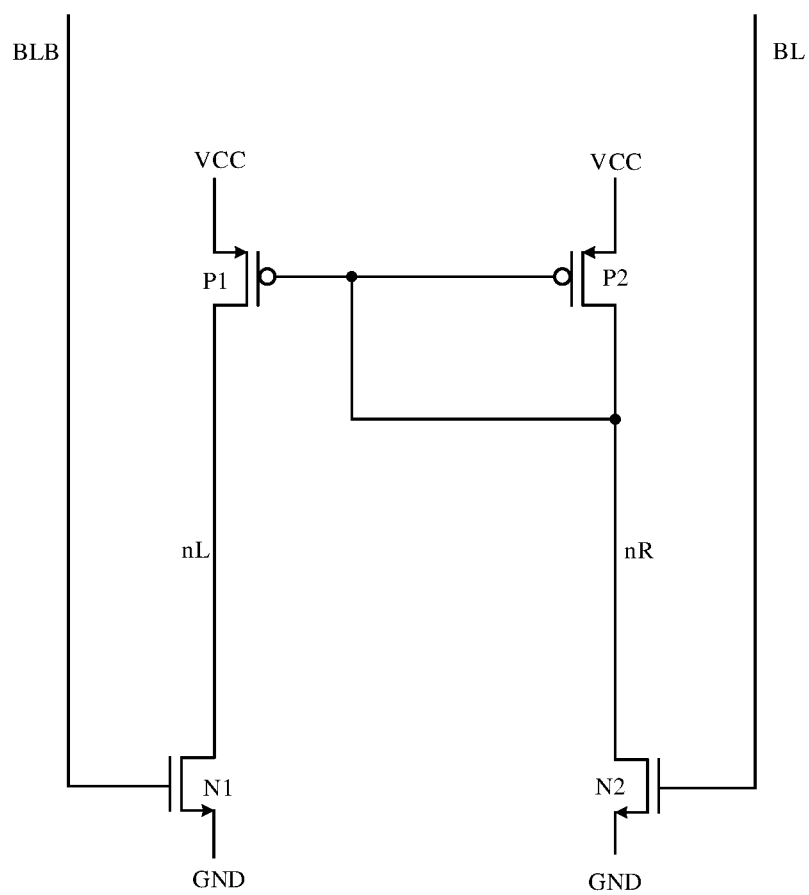
FIG. 13 schematically illustrates a circuit diagram of a sense amplifier in an inductive phase when data in a storage unit on a second bit line is read according to an embodiment of the present disclosure.

FIG. 13 is directed to the inductive phase of the sense amplifier when the data in the storage unit on the second bit line BLB is read. The control signal S1 and the control signal S3 are high levels, and the transistor N3 and the transistor N5 are on. Through the induction phase, the charge situation on the two branches tends to be stable.

It is to be appreciated that in some embodiments of the present disclosure, the operation phase of the sense amplifier may have no induction phase. That is, after the offset compensation phase, it is possible to directly enter the first amplification phase.

Figure 14:
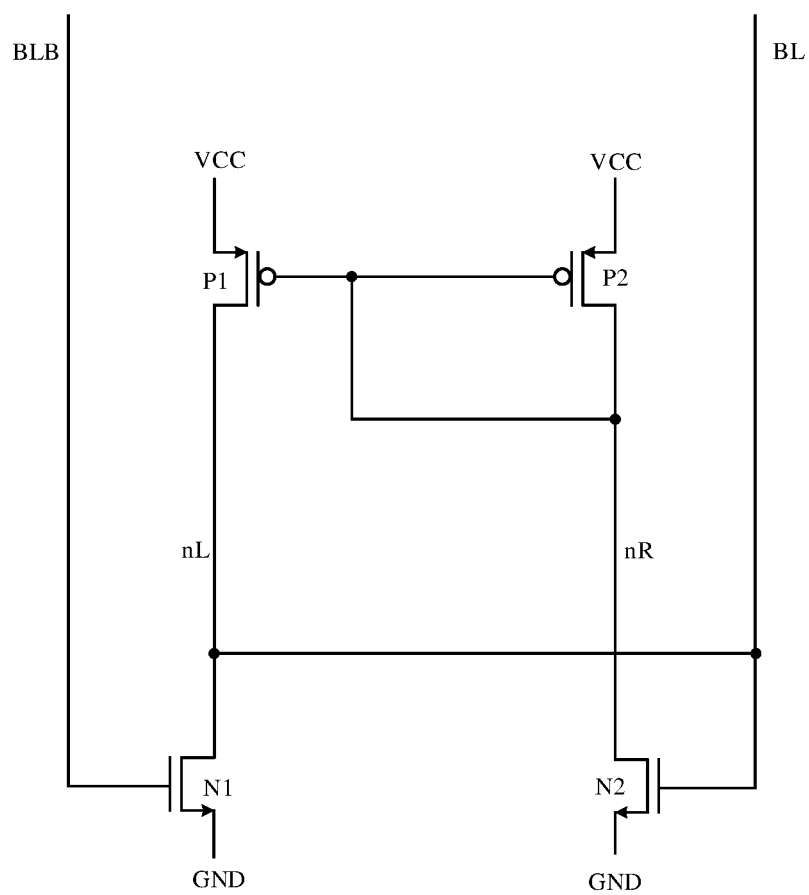
FIG. 14 schematically illustrates a circuit diagram of a sense amplifier in a first amplification phase when data in a storage unit on a second bit line is read according to an embodiment of the present disclosure.

FIG. 14 is directed to the first amplification phase of the sense amplifier when the data in the storage unit on the second bit line BLB is read. The control signal S1, the control signal S3 and the control signal S5 are high levels, and the word line control signal WLB is in the on state.

Correspondingly, the transistor N3, the transistor N5 and the transistor N7 are on, and the transistor N4, the transistor N6, the transistor N8 and the transistor N9 are off.

When "1" is read for the second bit line BLB, a gate voltage of the transistor N1 increases, conduction capability is improved and a drain voltage decreases. Since the drain is connected to the first bit line BL, the voltage on the first bit line BL decreases. Therefore, the purpose of controlling the non-read bit line voltage to be pre-amplified in the opposite direction is achieved, the voltage difference between the first bit line BL and the second bit line BLB is increased, thereby facilitating the subsequent process for amplifying the voltages of the first bit line BL and the second bit line BLB.

When "0" is read for the second bit line BLB, the gate voltage of the transistor N1 decreases. In this case, the drain voltage increases, that is, the voltage of the first bit line BL is pulled high. Thus, the purpose of increasing the voltage difference between the first bit line BL and the second bit line BLB is also achieved, thereby facilitating the subsequent process for amplifying the voltages of the first bit line BL and the second bit line BLB.

FIG. 15 is directed to the second amplification phase of the sense amplifier when the data in the storage unit on the second bit line BLB is read. The second amplification phase of FIG. 15 is the same as that of FIG. 9 described above, which is not elaborated here.

Further, the present disclosure also provides a method for controlling a sense amplifier.

FIG. 16 schematically illustrates a flowchart of a method for controlling a sense amplifier according to an exemplary embodiment of the present disclosure. As described above, the sense amplifier may include an amplification module and a control module.

Referring to FIG. 16, the method for controlling the sense amplifier may include the following operations.

In S162, when data in a storage unit on a first bit line is read, in a first amplification phase of the sense amplifier, the amplification module is configured to include a first current mirror structure and a mirror terminal of the first current mirror structure is connected to a second bit line by using the control module.

In S164, when data in a storage unit on the second bit line is read, in the first amplification phase of the sense amplifier, the amplification module is configured to include a second current mirror structure and a mirror terminal of the second current mirror structure is connected to the first bit line by using the control module.

According to the exemplary embodiments of the present disclosure, when the data in the storage unit on the first bit line is read, in an offset compensation phase of the sense amplifier, the amplification module is configured to include the first current mirror structure and a first diode structure by using the control module; and when the data in the storage unit on the second bit line is read, in the offset compensation phase of the sense amplifier, the amplification module is configured to include the second current mirror structure and a second diode structure by using the control module.

According to the exemplary embodiments of the present disclosure, the amplification module is configured as a cross-coupled amplification structure by using the control module in a second amplification phase after the first amplification phase of the sense amplifier.

According to the exemplary embodiments of the present disclosure, as described above, the sense amplifier may also include a precharge phase and an inductive phase, the details of which are described in the above description on the configuration of the sense amplifier and will not be elaborated herein.

According to the method for controlling the sense amplifier provided by the exemplary embodiments of the present disclosure, on the one hand, it is possible to pre-amplify a non-read bit line voltage in a opposite direction in the first amplification phase, so as to ensure that a voltage on the first bit line and a voltage on the second bit line can be effectively distinguished and amplified in the second amplification phase, thereby improving the accuracy of data reading and further improving the performance of the semiconductor memory. On the other hand, according to the difference between the data reading on the first bit line and the data reading on the second bit line, voltages on the bit lines at both sides of the sense amplifier can be adjusted respectively, so as to compensate the influence of the offset noise on the voltages on the both sides bit line of the sense amplifier, thereby further improving the performance of the semiconductor memory.

Further, the present disclosure provides a memory including the sense amplifier described above.

The memory in the exemplary embodiments of the present disclosure better achieves offset compensation and has a low read error rate, and thus the performance of the memory is greatly improved.

Other embodiments of the present disclosure will be apparent to those skilled in the art from consideration of the specification and practice of the invention disclosed herein. This application is intended to cover any variations, uses or adaptations of the present disclosure following the general principles thereof and including common knowledge or conventional techniques in the art that are not disclosed in the present disclosure. The specification and embodiments are regarded as exemplary only, and the true scope and spirit of the present disclosure is indicated by the claims.

It will be appreciated that the present disclosure is not limited to the exact structures that has been described above and illustrated in the accompanying drawings, and various modifications and changes may be made without departing from the scope thereof. The scope of the present disclosure is limited only by the appended claims.

The invention claimed is:

1. A sense amplifier, comprising:
   an amplification module, configured to read data in a storage unit on a first bit line or a second bit line; and
   a control module, electrically connected to the amplification module;
   wherein when the data in the storage unit on the first bit line is read, in a first amplification phase of the sense amplifier, the control module is configured to configure the amplification module to comprise a first current mirror structure and connect a mirror terminal of the first current mirror structure to the second bit line; and
   when the data in the storage unit on the second bit line is read, in the first amplification phase of the sense amplifier, the control module is configured to configure the amplification module to comprise a second current mirror structure and connect a mirror terminal of the second current mirror structure to the first bit line;
   wherein an operation phase of the sense amplifier comprises the first amplification phase and a second amplification phase, and a non-read bit line voltage is pre-amplified in a first direction during the first amplification phase, the first direction being opposite to a direction in which a read bit line voltage is amplified.

2. The sense amplifier of claim 1, wherein the amplification module comprises:
   a first positive channel metal oxide semiconductor (PMOS) transistor;
   a second PMOS transistor;
   a first negative channel metal oxide semiconductor (NMOS) transistor having a gate connected to the second bit line and a drain connected to a drain of the first PMOS transistor through a first node; and
   a second NMOS transistor having a gate connected to the first bit line and a drain connected to a drain of the second PMOS transistor through a second node;
   wherein when the data in the storage unit on the first bit line is read, in the first amplification phase of the sense amplifier, the control module is configured to configure the first PMOS transistor and the second PMOS transistor as the first current mirror structure and connect the second bit line to the second node; and
   when the data in the storage unit on the second bit line is read, in the first amplification phase of the sense amplifier, the control module is configured to configure the first PMOS transistor and the second PMOS transistor as the second current mirror structure and connect the first bit line to the first node.

3. The sense amplifier of claim 2, wherein the control module further comprises:
   a first switch having a first terminal connected to a gate of the first PMOS transistor and a second terminal connected to a gate of the second PMOS transistor;
   a second switch having a first terminal connected to the gate of the second PMOS transistor and a second terminal connected to the first node;
   a third switch having a first terminal connected to the second node and a second terminal connected to the gate of the first PMOS transistor;
   a fourth switch having a first terminal connected to the second node and a second terminal connected to the second bit line; and
   a fifth switch having a first terminal connected to the first bit line and a second terminal connected to the first node;
   wherein when the data in the storage unit on the first bit line is read, in the first amplification phase of the sense amplifier, the first switch, the second switch and the fourth switch are closed, and the third switch and the fifth switch are open; and when the data in the storage unit on the second bit line is read, in the first amplification phase of the sense amplifier, the first switch, the third switch and the fifth switch are closed, and the second switch and the fourth switch are open.

4. The sense amplifier of claim 3, wherein in the first amplification phase of the sense amplifier, sources of the first PMOS transistor and the second PMOS transistor receive a first voltage, and sources of the first NMOS transistor and the second NMOS transistor are connected to ground.

5. The sense amplifier of claim 4, wherein when the data in the storage unit on the first bit line is read, in an offset compensation phase of the sense amplifier, the control module is configured to configure the amplification module to comprise the first current mirror structure and a first diode structure; and when the data in the storage unit on the second bit line is read, in the offset compensation phase of the sense amplifier, the control module is configured to configure the amplification module to comprise the second current mirror structure and a second diode structure.

6. The sense amplifier of claim 5, wherein the control module further comprises:
a sixth switch having a first terminal connected to the first node and a second terminal connected to the second bit line; and
a seventh switch having a first terminal connected to the first bit line and a second terminal connected to the second node;
wherein in the first amplification phase of the sense amplifier, the sixth switch and the seventh switch are open; when the data in the storage unit on the first bit line is read, in the offset compensation phase of the sense amplifier, the sixth switch is open and the seventh switch is closed; and when the data in the storage unit on the second bit line is read, in the offset compensation phase of the sense amplifier, the sixth switch is closed and the seventh switch is open.

7. The sense amplifier of claim 6, wherein in the offset compensation phase of the sense amplifier, the sources of the first PMOS transistor and the second PMOS transistor receive the first voltage, and the sources of the first NMOS transistor and the second NMOS transistor are connected to ground.

8. The sense amplifier of claim 6, wherein the control module is configured to configure the amplification module as a cross-coupled amplification structure in the second amplification phase after the first amplification phase of the sense amplifier.

9. The sense amplifier of claim 8, wherein in the second amplification phase of the sense amplifier, the first switch, the sixth switch and the seventh switch are open, and the second switch, the third switch, the fourth switch and the fifth switch are closed.

10. The sense amplifier of claim 9, wherein in the second amplification phase of the sense amplifier, the sources of the first PMOS transistor and the second PMOS transistor receive the first voltage, and the sources of the first NMOS transistor and the second NMOS transistor are connected to ground.

11. The sense amplifier of claim 10, wherein there is an inductive phase of the sense amplifier between the offset compensation phase and the first amplification phase of the sense amplifier;
when the data in the storage unit on the first bit line is read, in the inductive phase of the sense amplifier, the first switch and the second switch are closed, and the third switch, the fourth switch, the fifth switch, the sixth switch and the seventh switch are open; and
when the data in the storage unit on the second bit line is read, in the inductive phase of the sense amplifier, the first switch and the third switch are closed, and the second switch, the fourth switch, the fifth switch, the sixth switch and the seventh switch are open.

12. The sense amplifier of claim 11, further comprising:
a precharge module, configured to perform precharge on the first bit line and the second bit line in a precharge phase before the offset compensation phase of the sense amplifier.

13. The sense amplifier of claim 12, wherein in the precharge phase of the sense amplifier, the sources of the first PMOS transistor, the second PMOS transistor, the first NMOS transistor and the second PMOS transistor all receive a second voltage.

14. The sense amplifier of claim 13, wherein the second voltage is less than the first voltage.

15. The sense amplifier of claim 5, wherein the first diode structure is the second NMOS transistor, and the second diode structure is the first NMOS transistor.

16. A memory, comprising a sense amplifier, wherein the sense amplifier comprises:
an amplification module, configured to read data in a storage unit on a first bit line or a second bit line; and
a control module, electrically connected to the amplification module;
wherein when the data in the storage unit on the first bit line is read, in a first amplification phase of the sense amplifier, the control module is configured to configure the amplification module to comprise a first current mirror structure and connect a mirror terminal of the first current mirror structure to the second bit line; and
when the data in the storage unit on the second bit line is read, in the first amplification phase of the sense amplifier, the control module is configured to configure the amplification module to comprise a second current mirror structure and connect a mirror terminal of the second current mirror structure to the first bit line;
wherein an operation phase of the sense amplifier comprises the first amplification phase and a second amplification phase, and a non-read bit line voltage is pre-amplified in a first direction during the first amplification phase, the first direction being opposite to a direction in which a read bit line voltage is amplified.

17. A method for controlling a sense amplifier comprising an amplification module and a control module, the method for controlling the sense amplifier comprising:
when data in a storage unit on a first bit line is read, in a first amplification phase of the sense amplifier, configuring, by using the control module, the amplification module to comprise a first current mirror structure and connecting a mirror terminal of the first current mirror structure to a second bit line; and
when data in a storage unit on the second bit line is read, in the first amplification phase of the sense amplifier, configuring, by using the control module, the amplification module to comprise a second current mirror structure and connecting a mirror terminal of the second current mirror structure to the first bit line;
wherein an operation phase of the sense amplifier comprises the first amplification phase and a second amplification phase, and a non-read bit line voltage is pre-amplified in a first direction during the first amplification phase, the first direction being opposite to a direction in which a read bit line voltage is amplified.

18. The method for controlling the sense amplifier of claim 17, wherein when the data in the storage unit on the first bit line is read, in an offset compensation phase of the sense amplifier, configuring, by using the control module, the amplification module to comprise the first current mirror structure and a first diode structure; and when the data in the storage unit on the second bit line is read, in the offset compensation phase of the sense amplifier, configuring, by using the control module, the amplification module to comprise the second current mirror structure and a second diode structure.

\* \* \* \* \*